United States Patent [19]

Ballman et al.

[11] 3,998,687
[45] Dec. 21, 1976

[54] TECHNIQUE FOR GROWTH OF THIN FILM LITHIUM NIOBATE BY LIQUID PHASE EPITAXY

[75] Inventors: Albert Anthony Ballman, Woodbridge; Ping King Tien, Chatham Township, Morris County, both of N.J.

[73] Assignee: Bell Telephone Laboratories, Incorporated, Murray Hill, N.J.

[22] Filed: Mar. 10, 1975

[21] Appl. No.: 557,106

[52] U.S. Cl. ............................... 156/619; 423/593
[51] Int. Cl.² ......................................... B01J 17/18
[58] Field of Search ....... 23/302 R, 305 RE, 305 R, 23/300; 156/600, 622, 624, 621, 619; 423/593; 148/26; 252/70

[56] References Cited
UNITED STATES PATENTS

| | | | |
|---|---|---|---|
| 2,758,008 | 8/1956 | Reisman et al. | 423/593 |
| 3,446,603 | 5/1969 | Loiacono et al. | 23/305 RE |

OTHER PUBLICATIONS

Tien et al., Applied Physics Letters, vol. 25, No. 10, 11/15/74, pp. 563–565.
Peterson et al., Applied Physics Letters, vol. 5, No. 3, 8/1/64,. pp. 62–64.
Miyazawa, Applied Physics Letters, vol. 23, No. 4, 8/15/73, pp. 198–200.
Preparation of Single Crystals —Lawson Butterworth Scientific Pub., 1958, London, pp. 184, 185.

*Primary Examiner*—Hiram H. Bernstein
*Attorney, Agent, or Firm*—Edward M. Fink

[57] ABSTRACT

A liquid phase epitaxial growth technique for growing lithium niobate films on lithium tantalate substrates involves growth from a flux system based on either lithium borate, lithium tungstate, tungsten oxide or potassium tungstate. Optical waveguiding occurs in films grown from the described flux systems.

1 Claim, 4 Drawing Figures

TECHNIQUE FOR GROWTH OF THIN FILM LITHIUM NIOBATE BY LIQUID PHASE EPITAXY

This invention relates to a technique for the growth of lithium niobate. More particularly, the present invention relates to a technique for the liquid phase epitaxial growth of thin films of ferro-electric lithium niobate on lithium tantalate substrates.

In recent years there has been a birth of interest in optical waveguiding devices utilizing thin films of ferroelectric materials as guiding elements. Among the more popular of such materials is lithium niobate, a uniaxial piezoelectric mixture with a point group symmetry of 3m. Heretofore, lithium niobate suitable for guiding purposes has been prepared either by means of a diffusion process designed to yield a surface film of higher index of refraction than the substrate upon which it is deposited, or by a melt phase epitaxy process in which lithium niobate is melted directly upon the surface of an isostructural lithium tantalate substrate.

Although each of these prior art processes has proven to be of value, inherent limitations therein have motivated continued investigation. Thus, for example, the diffusion process typically yields a layer evidencing negligible differences in refractive index between the lithium niobate and the substrate material, while leaving the substrate surface in its original highly polished state which readily facilitates device fabrication. In marked contrast, the melt phase process produces a greater differential in refractive index between lithium niobate and substrate but results in roughening of the substrate surface, so necessitating extensive polishing to yield a material capable of optical waveguiding.

In accordance with the present invention, these prior art limitations are effectively obviated by a novel liquid phase epitaxial growth process utilizing novel flux systems. Lithium niobate grown in accordance with the described technique evidences a sharp boundary interface and a maximum index differential with the substrate. Additionally, the substrate surface is found to be in a relatively flat and polished state, and consequently, well suited for optical waveguiding.

Briefly, the present invention involves immersing a substrate seed crystal into a supercooled melt of a flux system selected from among $Li_2B_2O_4 - Li_2Nb_2O_6$, $Li_2WO_4 - Li_2Nb_2O_6$, $K_2WO_4 - Li_2Nb_2O_6$, and $WO_3 - Li_2Nb_2O_6$, and, after establishing thermal equilibrium, the seed is withdrawn from the flux and cooling effected, the saturation of the solution on the seed resulting in growth.

The invention will be more readily understood by reference to the following detailed description taken in conjunction with the accompanying drawing, wherein FIG. 1 is a phase diagram of the $Li_2B_2O_4 - Li_2Nb_2O_6$ system showing temperature and compositional conditions required to effect crystallization of lithium niobate;

Figure 1:
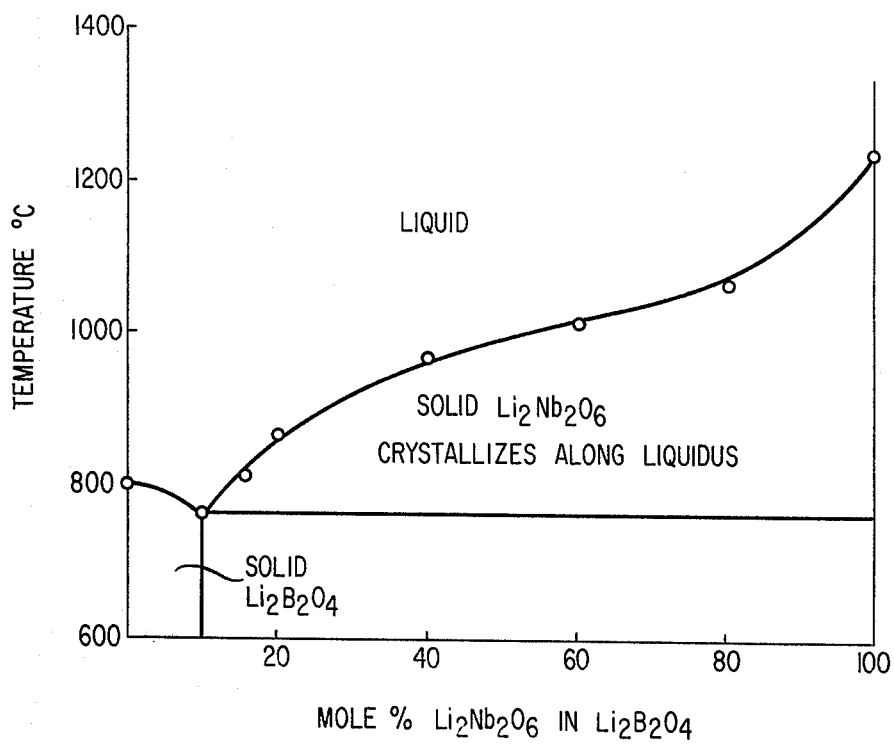
Figure 2:
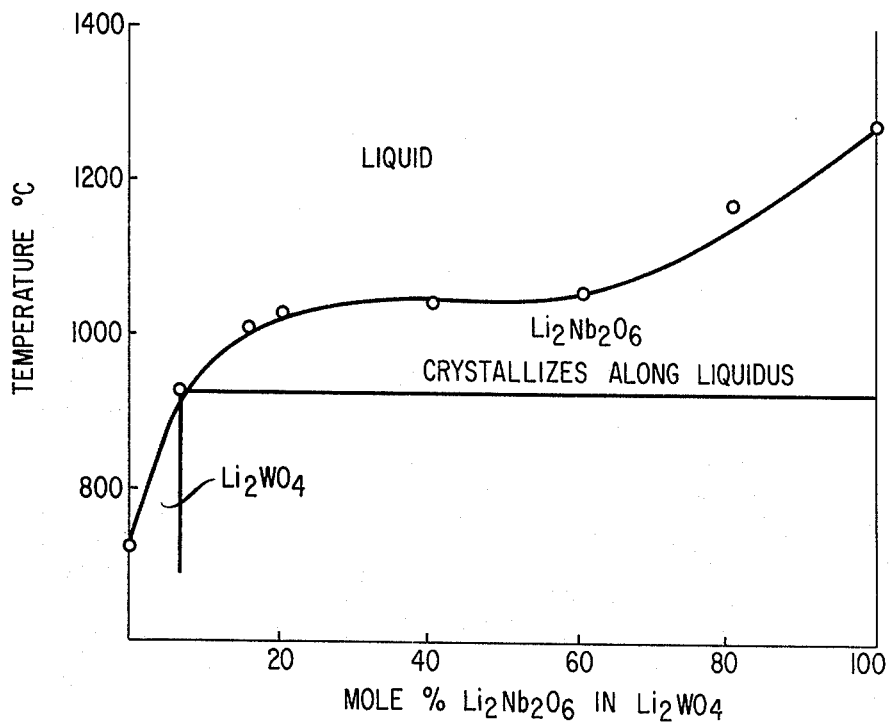
FIG. 2 is a phase diagram of the $Li_2WO_4 - Li_2Nb_2O_6$ system showing temperature and compositional conditions required to effect crystallization of lithium niobate.
Figure 3:
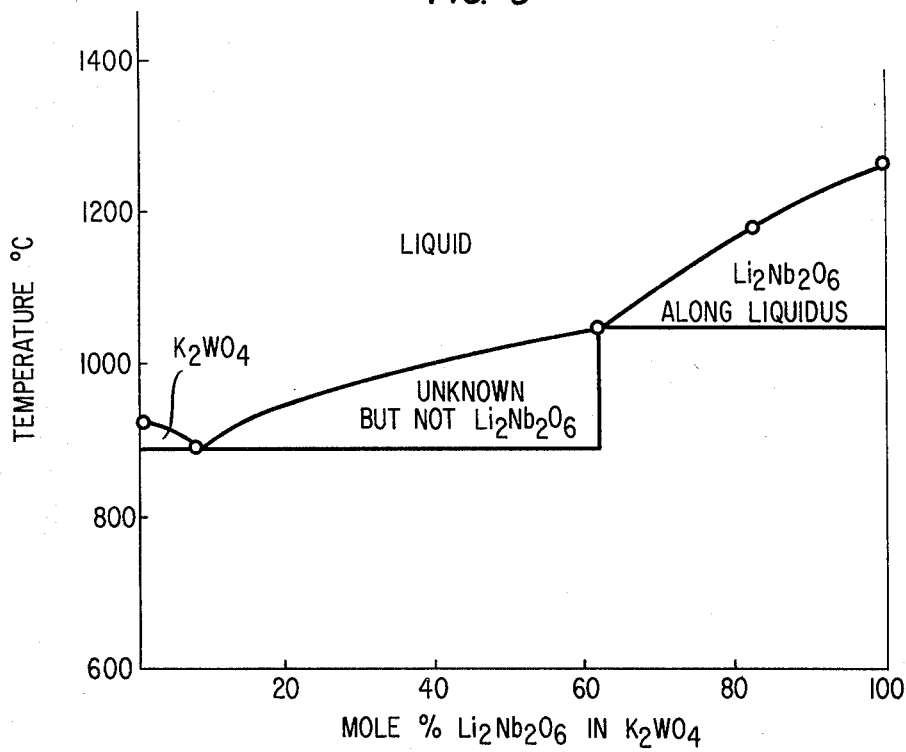
FIG. 3 is a phase diagram of the $K_2WO_4 - Li_2Nb_2O_6$ system showing temperature and compositional conditions required to effect crystallization of lithium niobate.
Figure 4:
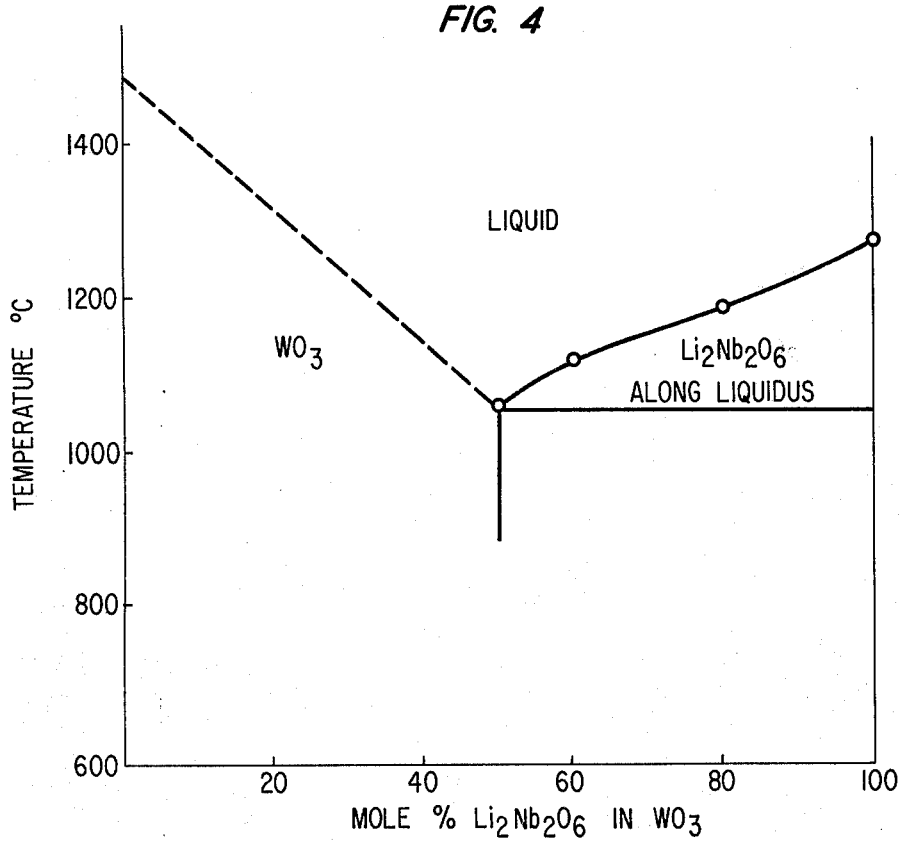
FIG. 4 is a phase diagram of the $WO_3 - Li_2Nb_2O_6$ system showing temperature and compositional conditions required to effect crystallization of lithium niobate.

With reference now more particularly to the drawing, FIGS. 1–4 show the compositional ranges for the flux systems considered and the temperatures required for crystallization of lithium niobate. It will be noted that such ranges correspond with the values shown in the following Table:

| System | Mole % $Li_2Nb_2O_6$ | Temperature Ranges |
|---|---|---|
| FIG. 1 | 10 – 100 | 780 – 1200° C |
| FIG. 2 | 8 – 100 | 900 – 1250° C |
| FIG. 3 | 60 – 100 | 1050 – 1250° C |
| FIG. 4 | 50 – 100 | 1050 – 1250° C |

Thus, analysis of the phase data reveals that in both the $Li_2B_2O_4 - Li_2Nb_2O_6$ and the $Li_2WO_4 - Li_2Nb_2O_6$ systems, the stable single phase lithium niobate of interest is obtained from compositions of approximately 10 mole percent and in the remaining two systems from compositions of at least 50 mole percent.

The technique employed for generating a phase stability diagram for the compositions of interest involved the addition of $LiNbO_3$ powder in small increments to a potential flux. After each addition the equilibrium solubility temperature was obtained by reading the melt surface with an optical pyrometer. Samples of the first compound to freeze out of the melt were obtained after each incremental addition of lithium niobate to the flux and the X-ray powder diagrams for such samples were obtained and compared with the known powder diagrams of the end members. The phase diagram boundaries were then plotted using the known compositions for each addition and the temperature reading obtained at equilibrium solubility. The resultant diagrams are shown in FIGS. 1–4.

In the practice of the present invention the substrate material comprising bulk single crystals of lithium tantalate is conveniently cut into wafers having a thickness of the order of 1mm and subjected to any conventional polishing procedure prior to growth. In order to observe differences in growth perfection as a function of the lattice match, several crystallographic orientations were used.

Successful epitaxial growth may be effected only when a cross lattice parameter match obtains for the substrate and the deposited film. The lattice parameter for lithium niobate and lithium tantalate in bulk crystals has been well characterized as has the lattice change in lithium niobate as a function of the lithium to niobium ratio in the melt. Analysis of the known data reveals that the $a_H$ direction is well suited for epitaxy between these isostructural compounds and also that the $a_H$ direction in lithium niobate gets larger as the niobium content in the melt increases, so suggesting a closer match between film and substrate as growth is effected from a melt containing a lithium to niobium ratio less than one.

Returning to the preparative process, the constituent components of the flux system chosen are added to a platinum crucible in an amount sufficient to yield the mole percent of lithium niobate in the system, as specified in the above Table. Next, the crucible is heated, as for example, by inductive heating, to approximately the equilibrium temperature at which a steady state exists. For the systems disclosed, equilibrium temperatures are as follows:

| Systems | Equilibrium Temperature |
| --- | --- |
| FIG. 1 | 780 – 1200° C |
| FIG. 2 | 900 – 1250° C |
| FIG. 3 | 1050 – 1250° C |
| FIG. 4 | 1050 – 1250° C |

Following, a temperature gradient is imposed at the molten flux-air interface by deliberately permitting a leak in the furnace, so effecting a nonequilibrium condition. It is at this point that the polished lithium tantalate substrate is slowly immersed into the crucible as a seed crystal. After obtaining thermal equilibrium, the seed crystal is withdrawn from the crucible and slowly cooled, typically at the rate of approximately 900°C per hour. Supersaturation of the solution permits growth of the lithium niobate at a rate controlled by the degree of supercooling, a rate of approximately 1 micron/min being typical. The resultant lithium niobate is then mechanically buffed to make it optically flat or parallel.

Evaluation of the grown films was conveniently effected by coupling in thereto a laser signal, as for example, a helium-neon signal, by means of a rutile prism film-coupler. Utilizing this technique, the index of refraction of the film at the depth of each observed light mode is obtained. In this manner the index of refraction profile is plotted for a given film thickness.

Optical loss was measured by positioning a second rutile prism-film coupler, on the film and permitting it to act as an out coupler. Loss measurements taken along the length of the optical path ranged from approximately 1 to 5 db/cm for the described liquid phase.

Laser light from a helium-neon laser operated at 6338 Angstroms was coupled into a series of lithium niobate films prepared as herein described. Such films have a thickness of about 3 $\mu$m and an optical path of 2 cm. Optical waveguides of this type were used for the construction of the light beam scan and deflection devices utilizing the electrooptic properties of the lithium niobate film.

What is claimed is:

1. Technique for the liquid phase epitaxial growth of thin film lithium niobate which comprises the steps of immersing lithium tantalate substrate seed crystal into a supercooled melt of a flux consisting of $Li_2B_2O_4$ — $Li_2Nb_2O_6$ wherein the mole percent of $Li_2Nb_2O_6$ ranges from 10–100 percent and withdrawing the seed crystal from the melt and effecting cooling thereof, so resulting in supersaturation of the melt solution on the seed and growth of a layer of lithium niobate.

* * * * *